United States Patent
Ogino et al.

(10) Patent No.: US 9,328,412 B2
(45) Date of Patent: May 3, 2016

(54) FE—PT-BASED FERROMAGNETIC MATERIAL SPUTTERING TARGET

(75) Inventors: Shin-ichi Ogino, Ibaraki (JP); Yuichiro Nakamura, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 13/816,043

(22) PCT Filed: Aug. 5, 2011

(86) PCT No.: PCT/JP2011/067936
§ 371 (c)(1),
(2), (4) Date: Feb. 8, 2013

(87) PCT Pub. No.: WO2012/029498
PCT Pub. Date: Mar. 8, 2012

(65) Prior Publication Data
US 2013/0168240 A1    Jul. 4, 2013

(30) Foreign Application Priority Data
Aug. 31, 2010  (JP) ................ 2010-195143

(51) Int. Cl.
C23C 14/34   (2006.01)
G11B 5/851   (2006.01)
H01F 41/18   (2006.01)
H01J 37/34   (2006.01)
H01F 1/06    (2006.01)
C23C 14/14   (2006.01)

(52) U.S. Cl.
CPC ............ *C23C 14/3414* (2013.01); *G11B 5/851* (2013.01); *H01F 41/183* (2013.01); *H01J 37/3405* (2013.01); *H01J 37/3426* (2013.01); *H01J 37/3429* (2013.01); *C23C 14/14* (2013.01); *H01F 1/068* (2013.01)

(58) Field of Classification Search
CPC . C23C 14/3414; G11B 5/851; H01J 37/3405; H01J 37/3426; H01J 37/3429; H01F 41/183; H01F 1/068
USPC .................................... 204/298.13
See application file for complete search history.

(56) References Cited

U.S. PATENT DOCUMENTS

| | | | | |
|---|---|---|---|---|
| 5,736,013 A * | 4/1998 | Ranjan et al. | ............. | 204/192.2 |
| 6,129,981 A * | 10/2000 | Okuyama et al. | ............. | 428/332 |
| 6,267,827 B1 | 7/2001 | Shindo et al. | | |
| 6,485,542 B2 | 11/2002 | Shindo et al. | | |
| 6,599,646 B2 * | 7/2003 | Suzuki et al. | ................. | 428/826 |
| 6,666,930 B2 * | 12/2003 | Aoyama et al. | ............... | 148/306 |
| 7,217,310 B2 | 5/2007 | Yahagi et al. | | |
| 7,347,969 B2 | 3/2008 | Yahagi et al. | | |
| 7,666,245 B2 | 2/2010 | Imori et al. | | |
| 7,691,172 B2 | 4/2010 | Imori et al. | | |
| 7,727,639 B2 | 6/2010 | Yahagi et al. | | |
| 7,909,949 B2 * | 3/2011 | Nakamura et al. | ............. | 148/557 |
| 7,927,434 B2 | 4/2011 | Nakamura et al. | | |
| 7,959,782 B2 | 6/2011 | Shindo | | |
| 8,936,706 B2 | 1/2015 | Koide | | |
| 9,034,154 B2 | 5/2015 | Nakamura et al. | | |
| 2007/0098590 A1 | 5/2007 | Shindo | | |
| 2007/0189916 A1 | 8/2007 | Zhang | | |
| 2007/0209547 A1 | 9/2007 | Irumata et al. | | |
| 2008/0057350 A1 | 3/2008 | Das et al. | | |
| 2009/0242393 A1 | 10/2009 | Satoh | | |
| 2010/0089622 A1 | 4/2010 | Irumata et al. | | |
| 2010/0320084 A1 | 12/2010 | Sato | | |
| 2011/0247930 A1 | 10/2011 | Sato | | |
| 2011/0284373 A1 | 11/2011 | Sato et al. | | |
| 2012/0097535 A1 | 4/2012 | Ogino et al. | | |
| 2012/0118734 A1 | 5/2012 | Sato et al. | | |
| 2012/0241316 A1 | 9/2012 | Arakawa | | |
| 2012/0273347 A1 | 11/2012 | Koide | | |
| 2013/0206591 A1 | 8/2013 | Takami et al. | | |
| 2013/0213803 A1 | 8/2013 | Sato et al. | | |
| 2013/0248362 A1 | 9/2013 | Ogino et al. | | |
| 2013/0292245 A1 | 11/2013 | Ikeda et al. | | |

(Continued)

FOREIGN PATENT DOCUMENTS

| | | | |
|---|---|---|---|
| JP | 2000-306228 A | | 11/2000 |
| JP | 2000-311329 A | | 11/2000 |
| JP | 2001098360 A | * | 4/2001 |
| JP | 2003-313659 A | | 11/2003 |
| JP | 2008-059733 A | | 3/2008 |
| JP | 2008-090917 A | | 4/2008 |
| JP | 2008179900 A | * | 8/2008 |
| JP | 2011-208167 A | | 10/2011 |
| WO | WO 2005083148 A1 | * | 9/2005 |

OTHER PUBLICATIONS

Tranlsation to Kato JP 2008-179900 published Aug. 2008.*
Translation to Fujioka (JP 2003-313659 cited on IDS) published Nov. 2003.*

*Primary Examiner* — John Brayton
(74) *Attorney, Agent, or Firm* — Howson & Howson LLP

(57) ABSTRACT

An Fe—Pt-based ferromagnetic material sputtering target comprising a metal and a metal oxide, wherein the metal has a composition in which Pt is contained in an amount of 5 mol % or more and 60 mol % or less and the remainder is Fe. An object of the present invention is to provide a ferromagnetic material sputtering target, which enables to form a magnetic recording layer composed of a magnetic phase such as an Fe—Pt alloy, and a non-magnetic phase to isolate the magnetic phase, and in which a metal oxide is used as one of the materials for the non-magnetic phase. Provided is a ferromagnetic material sputtering target wherein an inadvertent release of the metal oxide during sputtering and particle generation due to abnormal electrical discharge starting at a void inherently included in the target are suppressed, the adherence between the metal oxide and the matrix alloy is enhanced, and its density is increased.

6 Claims, No Drawings

(56) References Cited

U.S. PATENT DOCUMENTS

| | | |
|---|---|---|
| 2013/0306470 A1 | 11/2013 | Ogino et al. |
| 2014/0083847 A1 | 3/2014 | Sato |
| 2014/0231250 A1 | 8/2014 | Ogino et al. |
| 2014/0346039 A1 | 11/2014 | Ogino |
| 2014/0360871 A1 | 12/2014 | Sato et al. |
| 2015/0060268 A1 | 3/2015 | Ogino |

* cited by examiner

FE—PT-BASED FERROMAGNETIC MATERIAL SPUTTERING TARGET

BACKGROUND

The present invention relates to a ferromagnetic material sputtering target used for depositing a magnetic material thin film for a magnetic recording medium, in particular, a granular magnetic recording layer, and to an Fe—Pt-based ferromagnetic material sputtering target showing low particle generation.

In the field of magnetic recording represented by hard disk drives, ferromagnetic metal materials, i.e., Co, Fe, or Ni-based materials are used as materials of magnetic thin films that perform recording. For example, in recording layers of hard disks employing a longitudinal magnetic recording system, Co—Cr or Co—Cr—Pt ferromagnetic alloys of which main component is Co are used.

In recording layers of hard disks employing a perpendicular magnetic recording system that has been recently applied to practical use, composite materials composed of a Co—Cr—Pt ferromagnetic alloy, of which main component is Co, and a nonmagnetic inorganic grain are widely used. In many cases, the magnetic thin film of a magnetic recording medium such as a hard disk is produced by sputtering a ferromagnetic material sputtering target consisting primarily of the above-mentioned material because of its high productivity.

Meanwhile, a recording density of a magnetic recording medium is rapidly increasing every year, and the current surface density of 100 Gbits/in$^2$ may reach 1 Tbits/in$^2$ in the future.

If a recording density reaches 1 Tbits/in$^2$, the size of a recording bit is smaller than 10 nm. In that case, it is expected that superparamagnetism due to thermal fluctuation will pose a problem. It is also expected that magnetic recording media currently used, for example, a material in which magnetocrystalline anisotropy is enhanced by adding Pt to a Co—Cr based alloy, or a material in which magnetic coupling between magnetic grains is weakened by further adding B thereto, will not be sufficient.

This is because a grain with a size of 10 nm or less stably showing a ferromagnetic behavior is required to have higher magnetocrystalline anisotropy.

In view of the discussion above, an FePt phase having a $L1_0$ structure gathers much attention as a material for an ultra-high-density recording medium. An FePt phase having a $L1_0$ structure is also a potential material suitably applicable to a recording medium because it has an excellent corrosion resistance and oxidation resistance.

In order to use an FePt phase as a material for an ultrahigh-density recording medium, a technology is required to be developed where ordered FePt nanograins are dispersed in a similar orientation and in a magnetically isolated manner as high densely as possible.

From this point of view, a granular magnetic recording medium has been proposed. This granular medium, which has a structure where magnetic fine grains are deposited in a nonmagnetic matrix such as an oxide, needs to further have a structure where the magnetic grains are magnetically insulated mutually through the intervention of a nonmagnetic substance. For the granular magnetic recording medium and known Documents related to it, see Documents such as Patent Document 1, Patent Document 2, Patent Document 3 and Patent Document 4.

Moreover, the magnetic recording layer is composed of a magnetic phase such as an Fe—Pt alloy, and a non-magnetic phase to isolate the magnetic phase, and a metal oxide is effective as one of the materials for the non-magnetic phase. Many of these magnetic recording layers are formed by the sputtering deposition method. When trying to sputter a ferromagnetic material sputtering target containing a metal oxide using a magnetron sputtering apparatus, a problem may arise in general such an inadvertent release of the metal oxide during sputtering and abnormal electrical discharge starting at a void inherently included in the target, resulting in particle generation (dust adhered on a substrate).

In order to solve this problem, the adherence between a metal oxide and a matrix alloy is required to be enhanced, and in addition, a sputtering target is required to be more densified.

Patent Document 1: Japanese Laid-Open Patent Publication No. 2000-306228
Patent Document 2: Japanese Laid-Open Patent Publication No: 2000-311329
Patent Document 3: Japanese Laid-Open Patent Publication No. 2008-59733
Patent Document 4: Japanese Laid-Open Patent Publication No. 2008-169464

SUMMARY OF INVENTION

Technical Problem

An object of the present invention is to provide a ferromagnetic material sputtering target, which enables to form a magnetic recording layer composed of a magnetic phase such as an Fe—Pt alloy, and a non-magnetic phase to isolate the magnetic phase, and in which a metal oxide is used as one of the materials for the non-magnetic phase. Provided is a ferromagnetic material sputtering target wherein an inadvertent release of the metal oxide during sputtering and particle generation due to abnormal electrical discharge starting at a void inherently included in the target are suppressed, the adherence between the metal oxide and the matrix alloy is enhanced, and its density is increased.

Solution to Problem

After intensive studies to achieve the above object, the present inventors find that by selecting Fe as a main component of a matrix alloy and a metal oxide having good wettability, a high-density sputtering target having the enhanced adherence between the metal oxide and the matrix alloy can be produced. A sputtering target produced in this way can significantly reduce particle generation. In other wards, we find that a target with low particle generation can be obtained by using a metal oxide having good wettability.

Based on these findings, the present invention provides:
1) an Fe—Pt-based ferromagnetic material sputtering target comprising a metal and a metal oxide, wherein the metal has a composition in which Pt is contained in an amount of 5 mol % or more and 60 mol % or less and the remainder is Fe;
2) the Fe—Pt-based ferromagnetic material sputtering target according to 1) above, wherein a value of wettability for a molten metal of the metal oxide is 25 (J/molK) or less;
3) the Fe—Pt-based ferromagnetic material sputtering target according to 1) or 2) above, wherein a content ratio of the metal oxide is 15 to 70 vol %; and 4) the Fe—Pt-based ferromagnetic material sputtering target according to any one of 1) to 3) above, wherein the metal oxide having a grain size between 0.1 and 50 μm is dispersed in a matrix of the metal.

The present invention also provides:

5) the Fe—Pt-based ferromagnetic material sputtering target according to any one of 1) to 4) above, wherein the metal oxide refers to one of more oxides selected from Zr, Mg, Ti, Al, B, Ta, Nb, Zn, Si, Cr, Mn, and Ga;

6) the Fe—Pt-based ferromagnetic material sputtering target according to any one of 1) to 5) above, wherein the relative density is 97% or more; and 7) the Fe—Pt-based ferromagnetic material sputtering target according to any one of 1) to 6) above, wherein one or more elements selected from B, C, Ru, Ag, Au, and Cu are contained as an addition element in an amount of 5 mol % or more and 20 mol % or less.

Advantageous Effects of Invention

The present invention relates to a ferromagnetic material sputtering target, which enables to form a magnetic recording layer composed of a magnetic phase such as an Fe—Pt alloy, and a non-magnetic phase to isolate the magnetic phase, and in which a metal oxide is used as one of the materials for the non-magnetic phase. The present invention can effectively provide a ferromagnetic material sputtering target wherein an inadvertent release of the metal oxide during sputtering and particle generation due to abnormal electrical discharge starting at a void inherently included in the target are suppressed, the adherence between the metal oxide and the matrix alloy is enhanced, and its density is increased.

It can be advantageously used for deposition of a magnetic material thin film for a magnetic recording medium, in particular, a granular magnetic recording layer.

DETAILED DESCRIPTION

The Fe—Pt-based ferromagnetic material sputtering target of the present invention comprises: a metal having a composition in which Pt is contained in an amount of 5 mol % or more and 60 mol % or less and the remainder is Fe; and a metal oxide. This is a basis of the present invention.

As shown in the following Examples, we find that addition of one or more oxides selected from Zr, Mg, Ti, Al, B, Ta, Nb, Zn, Si, Cr, Mn, and Ga as a metal oxide can increase the density of the Fe—Pt-based ferromagnetic material sputtering target, and can significantly suppress particle generation. We also find that the addition of these oxides commonly improves the wettability for a molten metal of the metal oxide.

Wettability of a matrix alloy and a non-magnetic material can be predicted and evaluated by simulations using Calculated Wettability Index (hereafter, referred to as "CWI").

In particular, a CWI for a molten metal of a metal oxide having a value of 25 (J/molK) or less (Note that the unit "K" represents Kelvin as used throughout herein) is effective to produce a high-density ferromagnetic material sputtering target having good wettability and enhanced adherence between the metal oxide and the matrix alloy. A sputtering target produced in this manner can effectively suppress particle generation.

The wettability described above can be calculated from the change in the free energy and the enthalpy of Fe and each metal, oxide at any chemical equilibrium.

Calculation procedures are as follows: at first, the change in the free energy ($\Delta G_0$) is calculated for a reaction in which oxygen is exchanged between an arbitrary oxide (solid phase) and Fe (liquid phase); secondly, the change in the enthalpy ($\Delta H_{mix}$) for merging 1, mol of Fe into a metal component of the arbitrary oxide is calculated; and finally, a value calculated by ($\Delta G_0 + \Delta H_{mix}$)/RT was assigned to CWI, wherein R is the gas constant, and T is a temperature of the reaction field. A value of CWI is generally known to correlate with a contact angle between the arbitrary oxide and the metal component.

For the Fe—Pt-based ferromagnetic material sputtering target of the present invention, It is particularly effective that the content ratio of the metal oxide is 15 to 70 vol % and a metal oxide with a grain size of 0.1 to 50 μm is dispersed in a matrix of the metal. Thereby, a high-density sputtering target can be produced, and the obtained sputtering target can effectively suppress particle generation.

Moreover, the metal oxide described above is preferably one or more oxides selected from Zr, Mg, Ti, Al, B, Ta, Nb, Zn, Si, Cr, Mn, and Ga. They can improve wettability, all of them are effective for a high-density sputtering target, and the produced sputtering target can effectively suppress particle generation. In addition, a relative density of 97% or more can be achieved for the Fe—Pt-based ferromagnetic material sputtering target.

The Fe—Pt-based ferromagnetic material sputtering target of the present invention may also contain one or more elements selected from B, C, Ru, Ag, Au, and Cu as an additive element in an amount of 0.5 mol % or more and 20 mol % or less. Addition of these elements can increase a perpendicular coercive force of a film deposited using the ferromagnetic material sputtering target of the present invention, and can decrease an ordering temperature of Fe—Pt.

A ferromagnetic material sputtering target of the present invention can be produced by the powder metallurgy method. For production, powder of each metal element (powders of Fe and Pt) and powder of an additive metal element (powders of B, C, Ru, Ag, Au, Cu), if desired, are prepared. A maximum grain size of these powders is desirably 20 μm or less.

Instead of using powder of each metal element, an atomized alloy powder of these metals, for example, an alloy powder comprising a base metal powder and an additive metal element to be added as appropriate may also be used. In this case, grains having a mean grain size of 10 μm to 200 μm are desirably used.

Then the powders are weighed to achieve a desired composition, which is then mixed and ground using a known technique such as a ball mill. When adding a metal oxide powder, it may be mixed with a metal powder at this stage.

On the other hand, a metal powder of 0.5 μm or larger is more preferred because a problem such as promoted oxidation may arise when the powder is too small.

Moreover, for a metal oxide powder, powder having a maximum grain size of 5 μm or less is desirably used. On the other hand, a metal oxide powder of 0.1 μm or larger is more preferred because it is easily agglomerated when the powder is too small.

The powder mixture obtained in this way is molded and sintered by hot press. In addition to hot press, the plasma discharge sintering method and the hot isostatic sintering method may be used. For a holding temperature during sintering, the lowest temperature in a temperature range where a target is well compacted is preferably used. The temperature range is often 800 to 1300° C., depending on a composition of the target.

Next, this mixed powder is filled in a carbon mold, and hot pressed in vacuum atmosphere under the conditions of: a temperature of 1100° C., a holding time of 2 hours, and a pressure of 30 MPa, to obtain a sintered compact. This is further processed to a disc-shaped target with a diameter of 180 mm and a thickness of 5 mm by a lathe, and then subject to sputtering. Then the number of particles is counted.

Accordingly, a high-density Fe—Pt-oxide target in which the adherence between the metal oxide and the matrix alloy is enhanced can be produced. Even if a volume ratio of the oxide is increased, the density of the target can be maintained to be high, and particle generation during sputtering can be decreased. Moreover, as necessary, the wettability of the matrix alloy and the non-magnetic material can be preliminarily predicted by simulations, which then can be confirmed by experiments to show that an oxide having a CWI of 25 (J/molK) or less is effective. The smaller is this value, the better is the wettability.

The Fe—Pt-based ferromagnetic material sputtering target of the present invention produced in this way is useful as a target used for depositing a magnetic material thin film for a magnetic recording medium, in particular, a granular magnetic recording layer.

EXAMPLES

The present invention will be described by Examples and Comparative Examples below. Note that the Examples are merely illustrative and the present invention shall in no way be limited thereby. That is, the present invention is limited only by the claims, and shall encompass various modifications other than those included in the Examples of the present invention.

Example 1

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, zirconium oxide ($ZrO_2$) having a maximum grain size of 1 μm was used.

Then, the Fe powder, the Pt powder, and the $ZrO_2$ powder were weighed to 0.60 kg, 2.40 kg, and 0.60 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 97.4% could be obtained. This was further processed to a disc-shaped target with a diameter of 180 mm and a thickness of 5 mm by a lathe.

Then sputtering was performed using this sputtering target, and the number of particles was counted. The number of generated particles during sputtering is shown in Table 1. Note that the number of particles was evaluated after increasing the absolute number of particles by increasing a film thickness by about 200 times thicker (to a thickness of 1000 nm) than the normal thickness because the difference in the number of particles was not clearly seen at a thickness normally used for a product (a thickness of the recording layer is 5 to 10 nm). Hereafter, a similarly treatment was performed.

As shown in Table 1, the number of particles was 12. In this case, the volume ratio of the oxide ($ZrO_2$) was 22.5%. In this case, the following results were obtained: even if the volume ratio of the oxide ($ZrO_2$) was increased up to 70%, the density of the target was maintained to be high, and the number of particles generated during sputtering was 20 or less, which is less than the results in any Comparative Examples shown below.

On the other hand, the wettability of the matrix alloy and the non-magnetic material was preliminary predicted by simulations. The result showed that a measure of wettability CWI was 23.7 (J/molK). The smaller is the value, the better is the wettability (the same hereinafter). This wettability appears to improve the adherence between the metal oxide and the matrix alloy, and in addition, have a significant impact on the increased density of the sputtering target.

Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

TABLE 1

| | Oxide Species | Additive Element | Relative Density (%) | Number of Particles | Wettability CWI | Oxide (vol %) | Fe weight (Top kg/ Bottom mol %) | Pt weight (Top kg/ Bottom mol %) | Oxide weight (Top kg/ Bottom mol %) | Additive element weight (Top kg/ Bottom mol %) |
|---|---|---|---|---|---|---|---|---|---|---|
| Example 1 | $ZrO_2$ | | 97.4 | 12 | 23.7 | 22.5% | 0.6 kg<br>42.2% | 2.4 kg<br>48.3% | 0.6 kg<br>9.6% | |
| Example 2 | MgO | | 97.6 | 8 | 18 | 30.4% | 0.6 kg<br>35.2% | 2.4 kg<br>40.3% | 0.3 kg<br>24.4% | |
| Example 3 | $TiO_2$ | | 98.4 | 7 | 16.5 | 27.2% | 0.6 kg<br>40.1% | 2.4 kg<br>45.9% | 0.3 kg<br>14.0% | |
| Example 4 | $Al_2O_3$ | | 97.9 | 9 | 15.2 | 29.0% | 0.6 kg<br>41.3% | 2.4 kg<br>47.3% | 0.3 kg<br>11.3% | |
| Example 5 | $B_2O_3$ | | 97.8 | 10 | 15 | 46.4% | 0.6 kg<br>39.3% | 2.4 kg<br>45.0% | 0.3 kg<br>15.8% | |
| Example 6 | $Ta_2O_5$ | | 98.5 | 7 | 14.3 | 15.4% | 0.6 kg<br>45.3% | 2.4 kg<br>51.9% | 0.3 kg<br>2.9% | |
| Example 7 | $Nb_2O_5$ | | 98.2 | 8 | 11.8 | 26.3% | 0.6 kg<br>44.4% | 2.4 kg<br>50.9% | 0.3 kg<br>4.7% | |
| Example 8 | ZnO | | 98.5 | 8 | 9.6 | 22.2% | 0.6 kg<br>40.2% | 2.4 kg<br>46.0% | 0.3 kg<br>13.8% | |

TABLE 1-continued

| | Oxide Species | Additive Element | Relative Density (%) | Number of Particles | Wettability CWI | Oxide (vol %) | Fe weight (Top kg/ Bottom mol %) | Pt weight (Top kg/ Bottom mol %) | Oxide weight (Top kg/ Bottom mol %) | Additive element weight (Top kg/ Bottom mol %) |
|---|---|---|---|---|---|---|---|---|---|---|
| Example 9 | $SiO_2$ | | 98.8 | 7 | 7.3 | 42.0% | 0.6 kg 38.3% | 2.4 kg 43.9% | 0.3 kg 17.8% | |
| Example 10 | $Cr_2O_3$ | | 99.3 | 6 | 6.2 | 23.4% | 0.6 kg 42.9% | 2.4 kg 49.2% | 0.3 kg 7.9% | |
| Example 11 | MnO | | 99.2 | 6 | 6.1 | 24.9% | 0.6 kg 44.1% | 2.4 kg 50.5% | 0.3 kg 5.4% | |
| Example 12 | $Ga_2O_3$ | | 99.5 | 7 | 1.8 | 19.8% | 0.6 kg 43.6% | 2.4 kg 49.9% | 0.3 kg 6.5% | |
| Comparative Example 1 | CaO | | 95.3 | 64 | 32.5 | 32.1% | 0.6 kg 37.8% | 2.4 kg 43.3% | 0.3 kg 18.8% | |
| Comparative Example 2 | $Y_2O_3$ | | 96.9 | 53 | 27.6 | 24.1% | 0.6 kg 44.1% | 2.4 kg 50.5% | 0.3 kg 5.5% | |
| Comparative Example 3 | CoO | | 99.9 | — | −2 | 19.8% | 0.6 kg 39.7% | 2.4 kg 45.5% | 0.3 kg 14.8% | |
| Comparative Example 4 | $In_2O_3$ | | 99.8 | — | −2.3 | 18.1% | 0.6 kg 44.5% | 2.4 kg 51.0% | 0.3 kg 4.5% | |
| Comparative Example 5 | $GeO_2$ | | 99.9 | — | −2.9 | 20.4% | 0.6 kg 41.5% | 2.4 kg 47.5% | 0.3 kg 11.1% | |
| Example 13 | $SiO_2$ | | 98.4 | 19 | 7.3 | 62.8% | 0.6 kg 31.0% | 2.4 kg 35.5% | 0.7 kg 33.6% | |
| Example 14 | $SiO_2$ | | 99.2 | 6 | 7.3 | 22.5% | 0.6 kg 42.9% | 2.4 kg 49.1% | 0.12 kg 8.0% | |
| Example 15 | $TiO_2$ | | 98.2 | 16 | 16.5 | 55.5% | 0.6 kg 30.2% | 2.4 kg 34.6% | 1 kg 35.2% | |
| Example 16 | $Cr_2O_3$ | | 98.9 | 8 | 6.2 | 50.5% | 0.6 kg 36.3% | 2.4 kg 41.5% | 1 kg 22.2% | |
| Example 17 | $SiO_2$ | Au | 97.8 | 7 | 7.3 | 49.7% | 0.6 kg 30.3% | 2.4 kg 34.7% | 0.5 kg 23.5% | 0.4 kg 11.5% |
| Example 18 | $SiO_2$ | Ag | 97.1 | 10 | 7.3 | 54.5% | 0.6 kg 34.0% | 2.4 kg 39.0% | 0.5 kg 26.4% | 0.01 kg 0.6% |
| Example 19 | $SiO_2$ | Cu | 98.3 | 7 | 7.3 | 51.9% | 0.6 kg 31.1% | 2.4 kg 35.6% | 0.5 kg 24.1% | 0.1 kg 9.1% |
| Example 20 | $SiO_2$ | Cu | 98.8 | 6 | 7.3 | 38.4% | 0.6 kg 32.8% | 2.1 kg 32.8% | 0.3 kg 15.2% | 0.2 kg 19.2% |
| Example 21 | $SiO_2$ | Ru | 97.9 | 6 | 7.3 | 52.6% | 0.6 kg 32.2% | 2.4 kg 36.9% | 0.5 kg 25.0% | 0.1 kg 5.9% |
| Example 22 | $SiO_2$ | C | 97.0 | 18 | 7.3 | 45.5% | 0.6 kg 38.1% | 2.1 kg 38.2% | 0.3 kg 17.7% | 0.01 kg 5.9% |
| Example 23 | $SiO_2$ | B | 97.9 | 11 | 7.3 | 42.7% | 0.6 kg 37.9% | 2.1 kg 38.0% | 0.3 kg 17.6% | 0.01 kg 6.5% |
| Example 24 | $TiO_2$ | | 99.1 | 6 | 16.5 | 37.3% | 1.2 kg 88.5% | 0.3 kg 6.3% | 0.1 kg 5.2% | |
| Example 25 | $TiO_2$ | | 98.9 | 7 | 16.5 | 42.7% | 0.35 kg 30.8% | 2.38 kg 60.0% | 0.15 kg 9.2% | |

Example 2

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, magnesium oxide (MgO) having a maximum grain size of 0.5 μm was used.

Then, the Fe powder, the Pt powder, and the MgO powder were weighed to 0.60 kg, 2.40 kg, and 0.30 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 97.6% could be obtained. This was further processed to a disc-shaped target with a diameter of 180 mm and a thickness of 5 mm by a lathe.

Then sputtering was performed using this sputtering target, and the number of particles was counted. The number of generated particles during sputtering is shown in Table 1. As shown in Table 1, the number of particles was 8.

In this case, the volume ratio of the oxide (MgO) was 30.4%. In this case, the following results were obtained: even if the volume ratio of the oxide (MgO) was increased up to 70%, the density of the target was maintained to be high, and the number of particles generated during sputtering was 20 or less, which is less than the results in any Comparative Examples shown below.

In the same way as in Example 1, the wettability of the matrix alloy and the non-magnetic material was preliminary predicted by simulations. The results showed that a measure of wettability CWI was 18.0 (J/molK). This wettability appears to improve the adherence between the metal oxide and the matrix alloy, and in addition, have a significant impact on the increased density of the sputtering target.

Moreover, this wettability appears to suppress an inadvertent release of a metal oxide during sputtering, and in addition to this, suppress particle generation due to abnormal electrical discharge starting at a void inherently included in the target.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 3

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, titanium oxide ($TiO_2$) having a maximum grain size of 3 μm was used.

Then, the Fe powder, the Pt powder, and the $TiO_2$ powder were weighed to 0.60 kg, 2.40 kg, and 0.30 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 98.4% could be obtained. This was further processed to a disc-shaped target with a diameter of 180 mm and a thickness of 5 mm by a lathe.

Then sputtering was performed using this sputtering target, and the number of particles was counted. The number of generated particles during sputtering is shown in Table 1. As shown in Table 1, the number of particles was 7. In this case, the volume ratio of the oxide ($TiO_2$) was 27.2%. In this case, the following results were obtained: even if the volume ratio of the oxide ($TiO_2$) was increased up to 70%, the density of the target was maintained to be high, and the number of particles generated during sputtering was 20 or less, which is less than the results in any Comparative Examples shown below.

In the same way as in Example 1, the wettability of the matrix alloy and the non-magnetic material was preliminary predicted by simulations. The results showed that a measure of wettability CWI was 16.5 (J/molK). This wettability appears to improve the adherence between the metal oxide and the matrix alloy, and in addition, have a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 4

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, aluminum oxide ($Al_2O_3$) having a maximum grain size of 1 μm was used.

Then, the Fe powder, the Pt powder, and the $Al_2O_3$ powder were weighed to 0.60 kg, 2.40 kg, and 0.30 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 97.9% could be obtained. This was further processed to a disc-shaped target with a diameter of 180 mm and a thickness of 5 mm by a lathe.

Then sputtering was performed using this sputtering target, and the number of particles was counted. The number of generated particles during sputtering is shown in Table 1. As shown in Table 1, the number of particles was 9. In this case, the volume ratio of the oxide ($Al_2O_3$) was 29.0%. In this case, the following results were obtained: even if the volume ratio of the oxide ($Al_2O_3$) was increased up to 70%, the density of the target was maintained to be high, and the number of particles generated during sputtering was 20 or less, which is less than the results in any Comparative Examples shown below.

In the same way as in Example 1, the wettability of the matrix alloy and the non-magnetic material was preliminary predicted by simulations. The results showed that a measure of wettability CWI was 15.2 (J/molK). This wettability appears to improve the adherence between the metal oxide and the matrix alloy, and in addition, have a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 5

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, boron oxide ($B_2O_3$) having a maximum grain size of 3 μm was used.

Then, the Fe powder, the Pt powder, and the $B_2O_3$ powder were weighed to 0.60 kg, 2.40 kg, and 0.30 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 97.8% could be obtained. This was further processed to a disc-shaped target with a diameter of 180 mm and a thickness of 5 mm by a lathe.

Then sputtering was performed using this sputtering target, and the number of particles was counted. The number of generated particles during sputtering is shown in Table 1. As shown in Table 1, the number of particles was 10. In this case, the volume ratio of the oxide ($B_2O_3$) was 46.4%.

Note that, since the oxide ($B_2O_3$) in this case has a melting point of about 500° C., $B_2O_3$ may melt out when the mixed powder containing $B_2O_3$ is subject to hot pressing, and this may make density growth difficult. Therefore, when adding $B_2O_3$, a volume ratio of about 40% is preferred. In this way, the following results were obtained: the density of the target was maintained to be high, and the number of particles generated during sputtering was 20 or less, which is less than the results in any Comparative Examples shown below.

In the same way as in Example 1, the wettability of the matrix alloy and the non-magnetic material was preliminary predicted by simulations. The results showed that a measure of wettability CWI was 15.0 (J/molK). This wettability appears to improve the adherence between the metal oxide and the matrix alloy, and in addition, have a significant impact on the increased density of the sputtering target.

Moreover, this wettability appears to suppress an inadvertent release of a metal oxide during sputtering, and in addition to this, suppress particle generation due to abnormal electrical discharge starting at a void inherently included in the target.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 6

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, tantalum oxide ($Ta_2O_5$) having a maximum grain size of 0.7 μm was used.

Then, the Fe powder, the Pt powder, and the $Ta_2O_5$ powder were weighed to 0.60 kg, 2.40 kg, and 0.30 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 98.5% could be obtained. This was further processed to a disc-shaped target with a diameter of 180 mm and a thickness of 5 mm by a lathe.

Then sputtering was performed using this sputtering target, and the number of particles was counted. The number of generated particles during sputtering is shown in Table 1. As shown in Table 1, the number of particles was 7. In this case, the volume ratio of the oxide ($Ta_2O_5$) was 15.4%. In this case, the following results were obtained: even if the volume ratio of the oxide ($Ta_2O_5$) was increased up to 70%, the density of the target was maintained to be high, and the number of particles generated during sputtering was 20 or less, which is less than the results in any Comparative Examples shown below.

In the same way as in Example 1, the wettability of the matrix alloy and the non-magnetic material was preliminary predicted by simulations. The results showed that a measure of wettability CWI was 14.3 (J/molK). This wettability appears to improve the adherence between the metal oxide and the matrix alloy, and in addition, have a significant impact on the increased density of the sputtering target.

Moreover, this wettability appears to suppress an inadvertent release of a metal oxide during sputtering, and in addition to this, suppress particle generation due to abnormal electrical discharge starting at a void inherently included in the target.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 7

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, niobium oxide ($Nb_2O_5$) having a maximum grain size of 0.9 μm was used.

Then, the Fe powder, the Pt powder, and the $Nb_2O_5$ powder were weighed to 0.60 kg, 2.40 kg, and 0.30 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 98.2% could be obtained. This was further processed to a disc-shaped target with a diameter of 180 mm and a thickness of 5 mm by a lathe.

Then sputtering was performed using this sputtering target, and the number of particles was counted. The number of generated particles during sputtering is shown in Table 1. As shown in Table 1, the number of particles was 8. In this case, the volume ratio of the oxide ($B_2O_5$) was 26.3%. In this case, the following results were obtained: even if the volume ratio of the oxide ($Nb_2O_5$) was increased up to 70%, the density of the target was maintained to be high, and the number of particles generated during sputtering was 20 or less, which is less than the results in any Comparative Examples shown below.

In the same way as in Example 1, the wettability of the matrix alloy and the non-magnetic material was preliminary predicted by simulations. The results showed that a measure of wettability CWI was 11.8 (J/molK). This wettability appears to improve the adherence between the metal oxide and the matrix alloy, and in addition, have a significant impact on the increased density of the sputtering target.

Moreover, this wettability appears to suppress an inadvertent release of a metal oxide during sputtering, and in addition to this, suppress particle generation due to abnormal electrical discharge starting at a void inherently included in the target.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 8

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, zinc oxide (ZnO) having a maximum grain size of 3 μm was used.

Then, the Fe powder, the Pt powder, and the ZnO powder were weighed to 0.60 kg, 2.40 kg, and 0.30 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 98.5% could be obtained. This was further processed to a disc-shaped target with a diameter of 180 mm and a thickness of 5 mm by a lathe.

Then sputtering was performed using this sputtering target, and the number of particles was counted. The number of generated particles during sputtering is shown in Table 1. As shown in Table 1, the number of particles was 8. In this case, the volume ratio of the oxide (ZnO) was 22.2%. In this case, the following results were obtained: even if the volume ratio of the oxide (ZnO) was increased up to 70%, the density of the target was maintained to be high, and the number of particles generated during sputtering was 20 or less, which is less than the results in any Comparative Examples shown below.

In the same way as in Example 1, the wettability of the matrix alloy and the non-magnetic material was preliminary predicted by simulations. The results showed that a measure of wettability CWI was 9.6 (J/molK). This wettability appears to improve the adherence between the metal oxide and the matrix alloy, and in addition, have a significant impact on the increased density of the sputtering target.

Moreover, this wettability appears to suppress an inadvertent release of a metal oxide during sputtering, and in addition to this, suppress particle generation due to abnormal electrical discharge starting at a void inherently included in the target.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 9

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, silicon oxide ($SiO_2$) having a maximum grain size of 2 μm was used.

Then, the Fe powder, the Pt powder, and the $SiO_2$ powder were weighed to 0.60 kg, 2.40 kg, and 0.30 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 98.8% could be obtained. This was further processed to a disc-shaped target with a diameter of 180 mm and a thickness of 5 mm by a lathe.

Then sputtering was performed using this sputtering target, and the number of particles was counted. The number of generated particles during sputtering is shown in Table 1. As shown in Table 1, the number of particles was 7. In this case, the volume ratio of the oxide ($SiO_2$) was 42.0%. In this case, the following results were obtained: even if the volume ratio of the oxide ($SiO_2$) was increased up to 70%, the density of the target was maintained to be high, and the number of particles generated during sputtering was 20 or less, which is less than the results in any Comparative Examples shown below.

In the same way as in Example 1, the wettability of the matrix alloy and the non-magnetic material was preliminary predicted by simulations. The results showed that a measure of wettability CWI was 7.3 (J/molK). This wettability appears to improve the adherence between the metal oxide and the matrix alloy, and in addition, has a significant impact on the increased density of the sputtering target.

Moreover, this wettability appears to suppress an inadvertent release of a metal oxide during sputtering, and in addition to this, suppresses particle generation due to abnormal electrical discharge starting at a void inherently included in the target.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 10

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, chromium oxide ($Cr_2O_3$) having a maximum grain size of 3 μm was used.

Then, the Fe powder, the Pt powder, and the $Cr_2O_3$ powder were weighed to 0.60 kg, 2.40 kg, and 0.30 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 99.3% could be obtained. This was further processed to a disc-shaped target with a diameter of 180 mm and a thickness of 5 mm by a lathe.

Then sputtering was performed using this sputtering target, and the number of particles was counted. The number of generated particles during sputtering is shown in Table 1. As shown in Table 1, the number of particles was 6. In this case, the volume ratio of the oxide ($Cr_2O_3$) was 23.4%. In this case, the following results were obtained: even if the volume ratio of the oxide ($Cr_2O_3$) was increased up to 70%, the density of the target was maintained to be high, and the number of particles generated during sputtering was 20 or less, which is less than the results in any Comparative Examples shown below.

In the same way as in Example 1, the wettability of the matrix alloy and the non-magnetic material was preliminary predicted by simulations. The results showed that a measure of wettability CWI was 6.2 (J/molK). This wettability appears to improve the adherence between the metal oxide and the matrix alloy, and in addition, have a significant impact on the increased density of the sputtering target.

Moreover, this wettability appears to suppress an inadvertent release of a metal oxide during sputtering, and in addition to this, suppress particle generation due to abnormal electrical discharge starting at a void inherently included in the target.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 11

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, manganese oxide (MnO) having a maximum grain size of 3 μm was used.

Then, the Fe powder, the Pt powder, and the MnO powder were weighed to 0.60 kg, 2.40 kg, and 0.30 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 99.2% could be obtained. This was further processed to a disc-shaped target with a diameter of 180 mm and a thickness of 5 mm by a lathe.

Then sputtering was performed using this sputtering target, and the number of particles was counted. The number of generated particles during sputtering is shown in Table 1. As shown in Table 1, the number of particles was 6. In this case, the volume ratio of the oxide (MnO) was 24.9%. In this case, the following results were obtained: even if the volume ratio of the oxide (MnO) was increased up to 70%, the density of the target was maintained to be high, and the number of particles generated during sputtering was 20 or less, which is less than the results in any Comparative Examples shown below.

In the same way as in Example 1, the wettability of the matrix alloy and the non-magnetic material was preliminary predicted by simulations. The results showed that a measure of wettability CWI was 6.1 (J/molK). This wettability appears to improve the adherence between the metal oxide and the matrix alloy, and in addition, has a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 12

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, gallium oxide ($Ga_2O_3$) having a maximum grain size of 0.9 μm was used.

Then, the Fe powder, the Pt powder, and the $Ga_2O_3$ powder were weighed to 0.60 kg, 2.40 kg, and 0.30 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 99.5% could be obtained. This was further processed to a disc-shaped target with a diameter of 180 mm and a thickness of 5 mm by a lathe.

Then sputtering was performed using this sputtering target, and the number of particles was counted. The number of generated particles during sputtering is shown in Table 1. As shown in Table 1, the number of particles was 7. In this case, the volume ratio of the oxide ($Ga_2O_3$) was 19.8%. In this case, the following results were obtained: even if the volume ratio of the oxide ($Ga_2O_3$) was increased up to 70%, the density of the target was maintained to be high, and the number of particles generated during sputtering was 20 or less, which is less than the results in any Comparative Examples shown below.

In the same way as in Example 1, the wettability of the matrix alloy and the non-magnetic material was preliminary predicted by simulations. The results showed that a measure of wettability CWI was 1.8 (J/molK). This wettability appears to improve the adherence between the metal oxide and the matrix alloy, and in addition, have a significant impact on the increased density of the sputtering target.

Moreover, this wettability appears to suppress an inadvertent release of a metal oxide during sputtering, and in addition to this, suppress particle generation due to abnormal electrical discharge starting at a void inherently included in the target.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Comparative Example 1

A target was produced under the same conditions as in Example 2 except that CaO was added as the oxide. In this case, CaO used was preliminarily predicted for the wettability of the matrix alloy and the non-magnetic material by simulations. This predicted measure of wettability CWI was 32.5 (J/mol·K), showing CaO has poor wettability.

The relative density of the sintered target was 95.3%. It was a low-density Fe—Pt-oxide (CaO) target having poor adherence between the metal oxide and the matrix alloy.

Then sputtering was performed using this sputtering target, and the number of particles was counted. The number of generated particles during sputtering is shown in Table 1. As shown in Table 1, the number of particles was 64. In this case, the volume ratio of the oxide (CaO) was 32.1%. In this case, the following results were obtained: even if the volume ratio of the oxide (CaO) was increased up to 70%, the density of the target remained to be low, and the number of particles generated during sputtering exceeded 20, which is more than the results in any Examples shown above.

This decreased wettability appears to reduce the adherence between the metal oxide and the matrix alloy, and in addition, have a significant impact on the decreased density of the sputtering target. Moreover, this wettability appears to increase an inadvertent release of a metal oxide during sputtering, and in addition to this, increase particle generation due to abnormal electrical discharge starting at a void inherently included in the target. Therefore, the Fe—Pt-oxide (CaO) target doped with an oxide showing poor wettability (CaO) was found to be unfavorable.

Comparative Example 2

A target was produced under the same conditions as in Example 2 except that $Y_2O_3$ was added as the oxide. In this case, $Y_2O_3$ used was preliminarily predicted for the wettability of the matrix alloy and the non-magnetic material by simulations. This predicted measure of wettability CWI was 27.6 (J/mol·K), showing $Y_2O_3$ has poor wettability.

The relative density of the sintered target was 96.9%. It was a low-density Fe—Pt-oxide ($Y_2O_3$) target having poor adherence between the metal oxide and the matrix alloy.

Then sputtering was performed using this sputtering target, and the number of particles was counted. The number of generated particles during sputtering is shown in Table 1. As shown in Table 1, the number of particles was 53. In this case, the volume ratio of the oxide ($Y_2O_3$) was 24.1%. In this case, the following results were obtained: even if the volume ratio of the oxide ($Y_2O_3$) was increased up to 70%, the density of the target remained to be low, and the number of particles generated during sputtering exceeded 20, which is more than the results in any Examples shown above.

This decreased wettability appears to reduce the adherence between the metal oxide and the matrix alloy, and in addition, have a significant impact on the decreased density of the sputtering target. Moreover, this wettability appears to increase an inadvertent release of a metal oxide during sputtering, and in addition to this, increase particle generation due to abnormal electrical discharge starting at a void inherently included in the target. Therefore, the Fe—Pt-oxide ($Y_2O_3$) target doped with an oxide showing poor wettability ($Y_2O_3$) was found to be unfavorable.

Comparative Example 3

A target was tried to be produced under the same conditions as in Example 2 except that CoO was added as the oxide. In this case, CoO used was preliminarily predicted for the wettability of the matrix alloy and the non-magnetic material by simulations. This predicted measure of wettability CWI was −2.0 (J/mol·K).

The relative density of the sintered target was 99.9%. However, CoO was pyrolyzed at high temperature and could not exist in the sintered compact in the form of an oxide. Therefore a sintered target having an intended composition of the present invention could not be obtained. Note that in this case, the volume ratio of the oxide (CoO) was 19.8%.

Comparative Example 4

A target was tried to be produced under the same conditions as in Example 1 except that $In_2O_3$ was added as the oxide. In this case, $In_2O_3$ used was preliminarily predicted for the wettability of the matrix alloy and the non-magnetic material by simulations. This predicted measure of wettability CWI was −2.3 (J/mol·K).

The relative density of the sintered target was 99.8%. However, $In_2O_3$ was pyrolyzed at high temperature and could not exist in the sintered compact in the form of an oxide. Therefore a sintered target having an intended composition of the present invention could not be obtained. Note that in this case, the volume ratio of the oxide ($In_2O_3$) was 18.1%.

Comparative Example 5

A target was tried to be produced under the same conditions as in Example 1 except that $GeO_2$ was added as the oxide. In this case, $GeO_2$ used was preliminarily predicted for the wettability of the matrix alloy and the non-magnetic material by simulations. This predicted measure of wettability CWI was −2.9 (J/molK).

The relative density of the sintered target was 99.9%. However, $GeO_2$ was pyrolyzed at high temperature and could not exist in the sintered compact in the form of an oxide. Therefore a sintered target having an intended composition of the present invention could not be obtained. Note that in this case, the volume ratio of the oxide ($GeO_2$) was 20.4%.

Example 13

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, silicon oxide ($SiO_2$) having a maximum grain size of 2 μm was used.

Then, the Fe powder, the Pt powder, and the $SiO_2$ powder were weighed to 0.60 kg, 2.40 kg, and 0.70 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 98.4% could be obtained. This was further processed to a disc-shaped target with a diameter of 180 mm and a thickness of 5 mm by a lathe. Then sputtering was performed using this sputtering target, and the number of particles was counted.

In this way, a high-density Fe—Pt-oxide ($SiO_2$) target having good adherence between the metal oxide and the matrix alloy was able to be produced. The number of generated particles during sputtering is shown in Table 1.

As shown in Table 1, the number of particles was 19. In this case, the following results were obtained: even if the volume ratio of the oxide ($SiO_2$) was increased up to 62.8%, the density of the target was maintained to be high, and the number of particles generated during sputtering was 20 or less, which is less than the results in any Comparative Examples.

On the other hand, the wettability of the matrix alloy and the non-magnetic material was preliminary predicted by simulations. The results showed that a measure of wettability CWI was 7.3 (J/molK). The smaller is the value, the better is the wettability (the same hereinafter). This wettability appears to improve the adherence between the metal oxide and the matrix alloy, and in addition, have a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 14

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, silicon oxide ($SiO_2$) having a maximum grain size of 2 μm was used.

Then, the Fe powder, the Pt powder, and the $SiO_2$ powder were weighed to 0.60 kg, 2.40 kg, and 0.12 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 99.2% could be obtained. This was further processed to a disc-shaped target with a diameter of 180 mm and a thickness of 5 mm by a lathe.

Then sputtering was performed using this sputtering target, and the number of particles was counted.

The number of generated particles during sputtering is shown in Table 1. As shown in Table 1, the number of particles was 6. In this case, the following results were obtained: even if the volume ratio of the oxide ($SiO_2$) was increased up to 22.5%, the density of the target was maintained to be high, and the number of particles generated during sputtering was 20 or less, which is less than the results in any Comparative Examples.

On the other hand, the wettability of the matrix alloy and the non-magnetic material was preliminary predicted by simulations. The results showed that a measure of wettability CWI was 7.3 (J/molK). The smaller is the value, the better is the wettability (the same hereinafter). This wettability appears to improve the adherence between the metal oxide and the matrix alloy, and in addition, have a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 15

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, titanium oxide ($TiO_2$) having a maximum grain size of 3 μm was used.

Then, the Fe powder, the Pt powder, and the $TiO_2$ powder were weighed to 0.60 kg, 2.40 kg, and 1.00 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 98.2% could be obtained. This was further processed to a disc-shaped target with a diameter of 180 mm and a thickness of 5 mm by a lathe.

Then sputtering was performed using this sputtering target, and the number of particles was counted.

The number of generated particles during sputtering is shown in Table 1. As shown in Table 1, the number of particles was 16. In this case, the following results were obtained: even if the volume ratio of the oxide ($TiO_2$) was increased up to 55.5%, the density of the target was maintained to be high, and the number of particles generated during sputtering was 20 or less, which is less than the results in any Comparative Examples.

On the other hand, the wettability of the matrix alloy and the non-magnetic material was preliminary predicted by simulations. The results showed that a measure of wettability CWI was 16.5 (J/molK). The smaller is the value, the better is the wettability (the same hereinafter). This wettability appears to improve the adherence between the metal oxide and the matrix alloy, and in addition, have a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 16

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, chromium oxide ($Cr_2O_3$) having a maximum grain size of 3 μm was used.

Then, the Fe powder, the Pt powder, and the $Cr_2O_3$ powder were weighed to 0.60 kg, 2.40 kg, and 1.00 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 98.9% could be obtained. This was further processed to a disc-shaped target with a diameter of 180 mm and a thickness of 5 mm by a lathe.

Then sputtering was performed using this sputtering target, and the number of particles was counted.

The number of generated particles during sputtering is shown in Table 1. As shown in Table 1, the number of particles was 8. In this case, the following results were obtained: even if the volume ratio of the oxide ($Cr_2O_3$) was increased up to 50.5%, the density of the target was maintained to be high, and the number of particles generated during sputtering was 20 or less, which is less than the results in any Comparative Examples.

On the other hand, the wettability of the matrix alloy and the non-magnetic material was preliminary predicted by simulations. The results showed that a measure of wettability CWI was 6.2 (J/molK). The smaller is the value, the better is the wettability (the same hereinafter). This wettability appears to improve the adherence between the metal oxide and the matrix alloy, and in addition, have a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 17

A ferromagnetic material sputtering target of the present invention was produced by the powder metallurgy method. For the production, Fe powder, Pt powder and Au powder were prepared. For these powders, powder having a maximum grain size of 10 μm was used for each. Moreover, for a metal oxide powder, silicon oxide ($SiO_2$) having a maximum grain size of 2 μm was used.

Then, the Fe powder, the Pt powder, the $SiO_2$ powder, and the Au powder were weighed to 0.60 kg, 2.40 kg, 0.50 kg, and 0.40 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 97.8% could be obtained. This was further processed to a disc-shaped target with a diameter of 180 mm and a thickness of 5 mm by a lathe.

Then sputtering was performed using this sputtering target, and the number of particles was counted.

The number of generated particles during sputtering is shown in Table 1. As shown in Table 1, the number of particles was 7. In this case, the following results were obtained: even if the volume ratio of the oxide ($SiO_2$) was increased up to 49.7%, the density of the target was maintained to be high, and the number of particles generated during sputtering was 20 or less, which is less than the results in any Comparative Examples.

On the other hand, the wettability of the matrix alloy and the non-magnetic material was preliminary predicted by simulations. The results showed that a measure of wettability CWI was 7.3 (J/molK). The smaller is the value, the better is the wettability (the same hereinafter). This wettability appears to improve the adherence between the metal oxide and the matrix alloy, and in addition, have a significant impact on the increased density of the sputtering target.

Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 18

A ferromagnetic material sputtering target of the present invention was produced by the powder metallurgy method. For the production, Fe powder, Pt powder and Ag powder were prepared. For these powders, powder having a maximum grain size of 10 μm was used for each. Moreover, for a metal oxide powder, silicon oxide ($SiO_2$) having a maximum grain size of 2 μm was used.

Then, the Fe powder, the Pt powder, the $SiO_2$ powder, and the Ag powder were weighed to 0.60 kg, 2.40 kg, 0.50 kg, and 0.01 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 97.1% could be obtained. This was further processed to a disc-shaped target with a diameter of 180 mm and a thickness of 5 mm by a lathe.

Then sputtering was performed using this sputtering target, and the number of particles was counted.

The number of generated particles during sputtering is shown in Table 1. As shown in Table 1, the number of particles was 10. In this case, the following results were obtained: even if the volume ratio of the oxide ($SiO_2$) was increased up to 54.5%, the density of the target was maintained to be high, and the number of particles generated during sputtering was 20 or less, which is less than the results in any Comparative Examples.

On the other hand, the wettability of the matrix alloy and the non-magnetic material was preliminary predicted by simulations. The results showed that a measure of wettability CWI was 7.3 (J/molK). The smaller is the value, the better is the wettability (the same hereinafter). This wettability appears to improve the adherence between the metal oxide and the matrix alloy, and in addition, have a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 19

A ferromagnetic material sputtering target of the present invention was produced by the powder metallurgy method. For the production, Fe powder, Pt powder and Cu powder were prepared. For these powders, powder having a maximum grain size of 10 μm was used for each. Moreover, for a metal oxide powder, silicon oxide ($SiO_2$) having a maximum grain size of 2 μm was used.

Then, the Fe powder, the Pt powder, the $SiO_2$ powder, and the Cu powder were weighed to 0.60 kg, 2.40 kg, 0.50 kg, and 0.10 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 98.3% could be obtained. This was further processed to a disc-shaped target with a diameter of 180 mm and a thickness of 5 mm by a lathe.

Then sputtering was performed using this sputtering target, and the number of particles was counted.

The number of generated particles during sputtering is shown in Table 1. As shown in Table 1, the number of particles was 7. In this case, the following results were obtained: even if the volume ratio of the oxide ($SiO_2$) was increased up to 51.9%, the density of the target was maintained to be high, and the number of particles generated during sputtering was 20 or less, which is less than the results in any Comparative Examples.

On the other hand, the wettability of the matrix alloy and the non-magnetic material was preliminary predicted by simulations. The results showed that a measure of wettability CWI was 7.3 (J/molK). The smaller is the value, the better is the wettability (the same hereinafter). This wettability appears to improve the adherence between the metal oxide and the matrix alloy, and in addition, have a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 20

A ferromagnetic material sputtering target of the present invention was produced by the powder metallurgy method. For the production, Fe powder, Pt powder and Cu powder were prepared. For these powders, powder having a maximum grain size of 10 μm was used for each. Moreover, for a metal oxide powder, silicon oxide ($SiO_2$) having a maximum grain size of 2 μm was used.

Then, the Fe powder, the Pt powder, the $SiO_2$ powder, and the Cu powder were weighed to 0.60 kg, 2.10 kg, 0.30 kg, and 0.20 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 98.8% could be obtained. This was further processed to a disc-shaped target with a diameter of 180 mm and a thickness of 5 mm by a lathe.

Then sputtering was performed using this sputtering target, and the number of particles was counted.

The number of generated particles during sputtering is shown in Table 1. As shown in Table 1, the number of particles was 6. In this case, the following results were obtained: even if the volume ratio of the oxide ($SiO_2$) was increased up to 38.4%, the density of the target was maintained to be high, and the number of particles generated during sputtering was 20 or less, which is less than the results in any Comparative Examples.

On the other hand, the wettability of the matrix alloy and the non-magnetic material was preliminary predicted by simulations. The results showed that a measure of wettability CWI was 7.3 (J/molK). The smaller is the value, the better is the wettability (the same hereinafter). This wettability appears to improve the adherence between the metal oxide and the matrix alloy, and in addition, have a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 21

A ferromagnetic material sputtering target of the present invention was produced by the powder metallurgy method. For the production, Fe powder, Pt powder and Ru powder were prepared. For these powders, powder having a maximum grain size of 10 μm was used for each. Moreover, for a metal oxide powder, silicon oxide ($SiO_2$) having a maximum grain size of 2 μm was used.

Then, the Fe powder, the Pt powder, the $SiO_2$ powder, and the Ru powder were weighed to 0.60 kg, 2.40 kg, 0.50 kg, and 0.10 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 97.9% could be obtained. This was further processed to a disc-shaped target with a diameter of 180 mm and a thickness of 5 mm by a lathe.

Then sputtering was performed using this sputtering target, and the number of particles was counted.

The number of generated particles during sputtering is shown in Table 1. As shown in Table 1, the number of particles was 6. In this case, the following results were obtained: even if the volume ratio of the oxide ($SiO_2$) was increased up to 52.6%, the density of the target was maintained to be high, and the number of particles generated during sputtering was 20 or less, which is less than the results in any Comparative Examples.

On the other hand, the wettability of the matrix alloy and the non-magnetic material was preliminary predicted by simulations. The results showed that a measure of wettability CWI was 7.3 (J/molK). The smaller is the value, the better is the wettability (the same hereinafter). This wettability appears to improve the adherence between the metal oxide and the matrix alloy, and in addition, have a significant impact on the increased density of the sputtering target.

Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 22

A ferromagnetic material sputtering target of the present invention was produced by the powder metallurgy method. For the production, Fe powder, Pt powder and C powder were prepared. For these powders, powder having a maximum grain size of 10 μm was used for each. Moreover, for a metal oxide powder, silicon oxide ($SiO_2$) having a maximum grain size of 2 μm was used.

Then, the Fe powder, the Pt powder, the $SiO_2$ powder, and the C powder were weighed to 0.60 kg, 2.10 kg, 0.30 kg, and 0.01 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 97.0% could be obtained. This was further processed to a disc-shaped target with a diameter of 180 mm and a thickness of 5 mm by a lathe.

Then sputtering was performed using this sputtering target, and the number of particles was counted.

The number of generated particles during sputtering is shown in Table 1. As shown in Table 1, the number of particles was 18. In this case, the following results were obtained: even if the volume ratio of the oxide ($SiO_2$) was increased up to 45.5%, the density of the target was maintained to be high, and the number of particles generated during sputtering was 20 or less, which is less than the results in any Comparative Examples.

On the other hand, the wettability of the matrix alloy and the non-magnetic material was preliminary predicted by simulations. The results showed that a measure of wettability CWI was 7.3 (J/molK). The smaller is the value, the better is the wettability (the same hereinafter). This wettability appears to improve the adherence between the metal oxide and the matrix alloy, and in addition, have a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 23

A ferromagnetic material sputtering target of the present invention was produced by the powder metallurgy method. For the production, Fe powder, Pt powder and B powder were prepared. For these powders, powder having a maximum grain size of 10 μm was used for each. Moreover, for a metal oxide powder, silicon oxide ($SiO_2$) having a maximum grain size of 2 μm was used.

Then, the Fe powder, the Pt powder, the $SiO_2$ powder, and the B powder were weighed to 0.60 kg, 2.10 kg, 0.30 kg, and 0.01 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 97.9% could be obtained. This was further processed to a disc-shaped target with a diameter of 180 mm and a thickness of 5 mm by a lathe.

Then sputtering was performed using this sputtering target, and the number of particles was counted.

The number of generated particles during sputtering is shown in Table 1. As shown in Table 1, the number of particles was 11. In this case, the following results were obtained: even if the volume ratio of the oxide ($SiO_2$) was increased up to 42.7%, the density of the target was maintained to be high, and the number of particles generated during sputtering was 20 or less, which is less than the results in any Comparative Examples.

On the other hand, the wettability of the matrix alloy and the non-magnetic material was preliminary predicted by simulations. The results showed that a measure of wettability CWI was 7.3 (J/molK). The smaller is the value, the better is the wettability (the same hereinafter). This wettability appears to improve the adherence between the metal oxide and the matrix alloy, and in addition, have a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 24

A ferromagnetic material sputtering target of the present invention was produced by the powder metallurgy method. For the production, Fe powder and Pt powder were prepared. For these powders, powder having a maximum grain size of 10 μm was used for each. Moreover, for a metal oxide powder, titanium oxide ($TiO_2$) having a maximum grain size of 3 μm was used.

Then, the Fe powder, the Pt powder, and the $TiO_2$ powder were weighed to 1.20 kg, 0.30 kg, and 0.10 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 99.1% could be obtained. This was further processed to a disc-shaped target with a diameter of 180 mm and a thickness of 5 μm by a lathe.

Then sputtering was performed using this sputtering target, and the number of particles was counted.

The number of generated particles during sputtering is shown in Table 1. As shown in Table 1, the number of particles was 6. In this case, the following results were obtained: even if the volume ratio of the oxide ($TiO_2$) was increased up to 37.3%, the density of the target was maintained to be high, and the number of particles generated during sputtering was 20 or less, which is less than the results in any Comparative Examples.

On the other hand, the wettability of the matrix alloy and the non-magnetic material was preliminary predicted by simulations. The results showed that a measure of wettability CWI was 16.5 (J/molK). The smaller is the value, the better is the wettability (the same hereinafter). This wettability appears to improve the adherence between the metal oxide and the matrix alloy, and in addition, have a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

Example 25

A ferromagnetic material sputtering target of the present invention was produced by the powder metallurgy method. For the production, Fe powder and Pt powder were prepared. For these powders, powder having a maximum grain size of 10 µm was used for each. Moreover, for a metal oxide powder, titanium oxide ($TiO_2$) having a maximum grain size of 3 µm was used.

Then, the Fe powder, the Pt powder, and the $TiO_2$ powder were weighed to 0.35 kg, 2.38 kg, and 0.15 kg, respectively, and mixed and ground using the ball mill method. Thus, the metal oxide powder to be added was simultaneously mixed with the metal powders.

Next, this mixed powder was filled in a carbon mold, and hot pressed in vacuum atmosphere under the conditions of: a temperature suitably selected from the temperature range between 800 and 1300° C., a holding time of 2 hours, and a pressure of 30 MPa, to obtain a sintered compact. Sinterability was good, and a sintered compact having a relative density of 98.9% could be obtained. This was further processed to a disc-shaped target with a diameter of 180 mm and a thickness of 5 mm by a lathe.

Then sputtering was performed using this sputtering target, and the number of particles was counted.

The number of generated particles during sputtering is shown in Table 1. As shown in Table 1, the number of particles was 7. In this case, the following results were obtained: even if the volume ratio of the oxide ($TiO_2$) was increased up to 42.7%, the density of the target was maintained to be high, and the number of particles generated during sputtering was 20 or less, which is less than the results in any Comparative Examples.

On the other hand, the wettability of the matrix alloy and the non-magnetic material was preliminary predicted by simulations. The results showed that a measure of wettability CWI was 16.5 (J/molK). The smaller is the value, the better is the wettability (the same hereinafter). This wettability appears to improve the adherence between the metal oxide and the matrix alloy, and in addition, have a significant impact on the increased density of the sputtering target. Moreover, this wettability appears to suppress an inadvertent release of a metal oxide during sputtering, and in addition to this, suppress particle generation due to abnormal electrical discharge starting at a void inherently included in the target. The above results are shown in Table 1.

The Fe—Pt-based ferromagnetic material sputtering target of the invention produced in this fashion is useful as a target used for depositing a magnetic material thin film for a magnetic recording medium, in particular, a granular magnetic recording layer. In particular, mutual selection of a matrix alloy and an oxide and their properties are important. This can effectively suppress particle generation which easily occurs upon film formation with a sputtering target containing an oxide.

An object of the present invention is to provide a ferromagnetic material sputtering target, which enables to form a magnetic recording layer composed of a magnetic phase such as an Fe—Pt alloy, and a non-magnetic phase to isolate the magnetic phase, and in which a metal oxide is used as one of the materials for the non-magnetic phase. The ferromagnetic material sputtering target of the present invention: can effectively suppress an inadvertent release of the metal oxide during sputtering and particle generation due to abnormal electrical discharge starting at a void inherently included in the target; can enhance the adherence between the metal oxide and the matrix alloy; and can increase its density. Therefore, it is useful as a ferromagnetic material sputtering target used for depositing a magnetic material thin film for a magnetic recording medium, in particular, a granular magnetic recording layer.

The invention claimed is:

1. An Fe—Pt-based ferromagnetic material sputtering target, comprising:
   a metal alloy forming a matrix of the sputtering target; and
   grains of a metal oxide dispersed in the matrix of the metal alloy, the grains of the metal oxide having a grain size of 0.1 to 50 µm, and the total content of grains of the metal oxide forming 15 to 70 vol % of the sputtering target;
   wherein the metal alloy has a composition of 5 to 60 mol % Pt, 0.5 to 20 mol % C, and a remainder of Fe; and
   wherein the metal oxide is an oxide of at least one metal selected from the group consisting of Zr, Mg, Ti, Al, B, Ta, Nb, Zn, Si, Cr, Mn, and Ga.

2. An Fe—Pt-based ferromagnetic material sputtering target, comprising:
   a metal alloy forming the sputtering target;
   grains of a metal oxide dispersed in the metal alloy, the grains of the metal oxide having a grain size of 0.1 to 50 µm, and the total content of grains of the metal oxide forming 15 to 70 vol % of the sputtering target;
   wherein the metal alloy has a composition of 5 to 60 mol % Pt, 0.5 to 20 mol % of one or more elements selected from the group consisting of B, C, Ru, Ag, Au, and Cu, and a remainder of Fe, said one or more elements of said metal alloy including C; and
   wherein the metal oxide is an oxide of at least one metal selected from the group consisting of Zr, Mg, Ti, Al, B, Ta, Nb, Zn, Si, Cr, Mn, and Ga.

3. An Fe—Pt-based ferromagnetic material sputtering target according to claim 1, wherein said at least one metal of said metal oxide is at least one of B, Ta, Nb, Zn, Cr, Mn, and Ga.

4. The Fe—Pt-based ferromagnetic material sputtering target according to claim 2, wherein the metal oxide has a calculated wettability index (CWI) of 25 (J/molK) or less to the alloy in a molten state.

5. The Fe—Pt-based ferromagnetic material sputtering target according to claim 2, wherein the sputtering target has a relative density of 97% or more.

6. The Fe—Pt-based ferromagnetic material sputtering target according to claim 1, wherein the metal alloy is a sintered alloy matrix consisting of particles of sintered grains of Fe, Pt, and C, and wherein said grains of the metal oxide originate from grains of a powder of the metal oxide and are dispersed among the particles forming the sintered alloy matrix.

* * * * *